United States Patent [19]
Meister et al.

[11] Patent Number: 5,643,836
[45] Date of Patent: Jul. 1, 1997

[54] METHOD FOR PRODUCING A SEMICONDUCTOR LAYER STRUCTURE HAVING A PLANARIZED SURFACE AND THE USE THEREOF IN THE MANUFACTURE OF BIPOLAR TRANSISTORS AND DRAMS

[75] Inventors: Thomas Meister, Taufkirchen; Reinhard Stengl, Stadtbergen, both of Germany

[73] Assignee: Siemens Aktiengesellschaft, Munich, Germany

[21] Appl. No.: 279,106

[22] Filed: Jul. 22, 1994

[30] Foreign Application Priority Data

Jul. 27, 1993 [DE] Germany ............... 43 25 188.9

[51] Int. Cl.⁶ ............................................. H01L 21/465
[52] U.S. Cl. ........................ 437/228; 437/235; 437/238
[58] Field of Search ............................. 156/636.1, 644.1, 156/645.1, 652.1, 653.1; 437/235, 238, 228; 216/88; 430/311

[56] References Cited

U.S. PATENT DOCUMENTS

| | | |
|---|---|---|
| 4,735,917 | 4/1988 | Flatley et al. ............... 437/228 |
| 4,914,049 | 4/1990 | Huang et al. ............... 437/228 |
| 4,962,064 | 10/1990 | Haskell et al. ............... 437/228 |
| 5,242,853 | 9/1993 | Sato et al. ............... 437/67 |
| 5,459,096 | 10/1995 | Venkatesan et al. ............... 437/228 |
| 5,508,233 | 4/1996 | Yost et al. ............... 437/228 |

FOREIGN PATENT DOCUMENTS

3625742A1  6/1987  Germany.

OTHER PUBLICATIONS

Japanese Abstract, O. Hisashi, "Contact Forming Method and Fabrication of Semiconductor Device", vol. 16, No. 554 (E–1293) Nov. 25, 1992, JP4211120, Aug. 3, 1992.

Japanese Abstract, M. Mutsuki, "Manufacture of Semiconductor Device", vol. 17, No. 125, (E–1332), Mar. 16, 1993, JP4299846, Oct. 23, 1992.

Japanese Abstract, K. Tetsuo, "Manufacture of Semiconductor Device", vol. 15, No. 383, (E–1116), Sep. 27, 1991, JP3152931, Jun. 28, 1991.

Japanese Abstract, H. Masahito, "Forming Method of Multilayer Wiring", vol. 17, No. 431, (E–1411), Aug. 10, 1993, JP5090261, Apr. 9, 1993.

Japanese Abstract, M. Keimei, "Manufacture of Semiconductor Device", vol. 11, No. 231, (E–527), Jul. 28, 1987, JP62046543, Feb. 28, 1987.

Kaanta, Carter W. et al.: "Dual Damascene: A ULSI Wiring Technology," from the VMIC Conference, Jun. 1991, pp. 144–152.

Hayashi, Yoshihiro et al.: "Nitride Masked Polishing (NMP) Technique for Surface Planarization of Interlayer–Dielectric Films," from Extended Abstracts of the 1992 International Conf. on Solid State Devices & Materials, pp. 533–535.

Comello, Victor, ed.: "Planarization Using RIE and Chemical Mechanical Polish," in Semiconductor International, Mar., 1990. (No Pages Given).

Nagy, Andrew & Helbert, John: "Planarized Inorganic Interlevel Dielectric for Multilevel Metallization, Part I," in Solid State Technology, Jan. 1991, pp. 53–56.

*Primary Examiner*—John S. Chu
*Attorney, Agent, or Firm*—Hill, Steadman & Simpson

[57] ABSTRACT

An insulating layer is applied onto the surface of a semiconductor layer structure having elevations up to a maximum step height. The thickness of the insulating layer is greater than the maximum step height. The insulating layer is structured to have irregularities with an essentially identical lateral expanse in the region of the edges of the elevations. The irregularities are planarized by chemical mechanical polishing and/or by deposition, flowing and etch-back of a planarization layer.

10 Claims, 3 Drawing Sheets

METHOD FOR PRODUCING A SEMICONDUCTOR LAYER STRUCTURE HAVING A PLANARIZED SURFACE AND THE USE THEREOF IN THE MANUFACTURE OF BIPOLAR TRANSISTORS AND DRAMS

BACKGROUND OF THE INVENTION

1. Field of the Invention

The present invention is directed generally to semiconductors and more specifically to a method for producing a semiconductor layer structure having a planarized surface and the use thereof in the manufacture of bipolar transistors and DRAMS.

2. Description of the Related Art

The planarization of the surface of a semiconductor layer structure is becoming more significant with increasing miniaturization of microelectronic circuit structures and with the increasing use of multi-layer wirings. The reduced focus depth in sub-µm lithography requires a far-reaching planarization of the surface of a semiconductor layer structure after every process step. Independently of these lithography problems, a planarization of the surface of a semiconductor layer structure during the process management is advantageous, since the adhesion of lacquer or other residues of materials at corners and edges is thereby avoided.

The term "local planarization" has become common usage in the literature when a planarity at the surface is satisfied only for specific structure sizes. When the planarity is satisfied for all structures over the entire surface of the semiconductor layer structure, then the term used is "global planarization".

For planarization of the surface of a semiconductor layer structure, it is known to apply a planarization layer that compensates for the irregularities in the surface by flowing (see, for example, A. Nagy et al, Solid State Techn., Jan. 1991, pages 53–56). The planarization layer is usually applied onto an insulating layer, particularly onto an intermediate oxide layer or a passivation layer. The surface of the semiconductor layer structure is prepared for following process steps by etching the planarization layer back. The planarization layer is thereby maximally etched back to such an extent that the surface of the insulating layer is uncovered in the region of the highest structures. However, interspaces between structures having this height remain filled with the material of the planarization layer.

The planarization that can be achieved in this method is dependent on the flow length of the lacquer or the oxide of the planarization layer. Commonly employed lacquers or oxides have flow lengths between 10 µm and 200 µm. When the surface to be planarized has larger structures than the flow length, then the thickness of the planarization layer on larger structures is increased, since a compensation by flowing only occurs in the region of the edge of the structures. These irregularities in the planarization layer are transferred into the surface in the following etch-back.

In order to avoid such irregularities, it has been proposed (see, for example, A. Nagy et al, Solid State Techn., Jan. 1991, pages 53 through 56 and V. Comello, 28/Semiconductor International, March 1990) to produce filler structures in larger regions free of structures before the deposition of the planarization layer. These filler structures are produced, for example, of photoresist by using an additional photo technique. Thus, only small interspaces that need be filled by flowing are present between the structures. Only a slight flowing of the planarization layer is required due to the reduction in the expanse of the interspaces. Since standard insulating layers are usually deposited with more or less conformal edge coverage, an additional mask that must be matched to the geometrical arrangement of the structures and to the thickness of the insulating layer is necessary for producing the filler structures. The filler structures must be formed of a material that can be etched with the same etching rate as the insulating layer.

Another known planarization method is polishing with chemical-mechanical erosion that is also referred to as chemical mechanical polishing (CMP) and that, for example, is known from V. Comello 28/Semiconductor International, March 1990 and Y. Hayashi et al, Ext. Abst. of Int. Conf. on Solid State Dev. and Mat., Business Center for Acad. Soc. Japan, XXVIII, pages 533–535, 1992. A polishing agent is thereby applied onto the surface to be planarized and is mechanically polished with a polishing disk. Raised structures having a smaller expanse are thereby eroded more greatly than structures having a greater expanse. (See Y. Hayashi et al, Ext. Abst. of Int. Conf. on Solid State Dev. and Mat., Business Center for Acad. Soc. Japan, XXVIII, pages 533 through 535, 1992).

Due to the finite stiffness of polishing disks, concavities occur in larger regions free of structures in chemical mechanical polishing (see C,W. Kaanta et al, VMIC Conference IEEE, June 1991, pages 144 through 152). In order to avoid these, it has been proposed in Y. Hayashi et al, Ext. Abst. of Int. Conf. on Solid State Dev. and Mat., Business Center for Acad. Soc. Japan, XXVIII, pages 533 through 535, 1992, to first apply a planarization layer for planarization with which a preplanarization is undertaken by flowing and etch-back. Then to achieve the final global planarization, chemical mechanical polishing is used.

The present invention provides a method for producing a semiconductor layer structure having a planarized surface with which irregularities in the region of larger structures as well as larger structure-free regions are avoided. In particular, the method should be suitable for use in the manufacture of bipolar transistors and DRAMS.

In the method of the invention, an insulating layer whose thickness is greater than the maximum step height is applied onto the surface of a semiconductor layer structure that has elevations having a height up to a maximum step height. The insulating layer is subsequently structured such that it has irregularities in the region of the edges of the elevations. These irregularities have essentially the same lateral expanse. Subsequently, irregularities are planarized by chemical mechanical polishing and/or deposition, flowing and etch-back of a planarization layer. Only these irregularities need be planarized in the method of the invention. The expanse of the irregularities is dependent on the size of the elevations and on the spacing between neighboring elevations. The problems that derive in known methods in the planarization of surfaces having larger structures and larger structure-free regions are therefore avoided.

For structuring the insulating layer, it lies within the scope of the invention to apply a stop layer having essentially conformal edge coverage under the insulating layer and to apply an auxiliary layer onto the insulating layer. Thus, the insulating layer can be selectively etched both relative to the auxiliary layer as well as to the stop layer. Openings are produced in the auxiliary layer above the elevations, and the expanses of these openings are less than or equal to the expanse of the elevations and the surface of the insulating layer being uncovered in them. The structuring of the insulating layer then occurs selectively relative to the auxiliary layer and relative to the stop layer in an isotropic etching process. The auxiliary layer is removed after the structuring of the insulating layer.

The openings in the auxiliary layer are preferably formed by using a photolithographic process, whereby an auxiliary mask is used. The auxiliary mask essentially has the same structures with inverse contrast as a mask used in the manufacture of the elevations. The structures in the auxiliary mask are at most as large as those in the mask. It is advantageous to diminish the size of the structures in the auxiliary mask by a reserve corresponding to the alignment tolerance of the mask.

It lies within the scope of the invention to implement the isotropic etching process at least until the surface of the stop layer is reached inside the openings. Peaks that project beyond the level of the insulating layer thereby occur at the edges of the elevations. These can be effectively planarized thereafter by chemical mechanical polishing.

According to another embodiment of the invention, the isotropic etching process is implemented at least until an oxide thickness of $d_{ox}=h+h/2+D$ has been etched, whereby h is the thickness of the insulating layer and D is the alignment precision with which the openings are produced relative to the elevations. In this case, the insulating layer is etched back until no peaks of the insulating layer remain above the maximum step height. Since the isotropic etching process attacks selectively relative to the auxiliary layer and relative to the stop layer, an under-etching is formed under the auxiliary layer.

Also it lies within the scope of the invention to apply a further insulating layer surface-wide after the removal of the auxiliary layer. This further insulating layer is provided with an essentially planar surface by using chemical polishing and/or by deposition, flowing and etch-back of a planarization layer. In this embodiment, too, only structures having the lateral expanse of the under-etching need be planarized.

The method is especially suited for the planarization of the surface of a semiconductor layer structure having a microelectronic circuit. The microelectronic circuit is particularly realized in a silicon substrate or in an SOI substrate. In this case, the insulating layer is at least part of an intermediate oxide layer that is essentially $SiO_2$. In this case, the stop layer has $Si_3N_4$ at least at its surface. The stop layer is preferably formed as a double layer of $SiO_2$ and an $Si_3N_4$ layer. In this case, the auxiliary layer is preferably polysilicon.

The method is quite versatile. In particular, it can be used in the manufacture of bipolar transistors. After the formation of the planar surface, an opening on a semiconductor surface is thereby produced in the insulating layer, and the active transistor regions are produced in this semiconductor surface by selective epitaxy.

Another advantageous use of the present invention is in the manufacture of a DRAM having shallow trench insulation.

The invention shall be set forth in greater detail below with reference to the figures and to an exemplary embodiment.

DETAILED DESCRIPTION OF THE PREFERRED EMBODIMENTS

Figure 1:
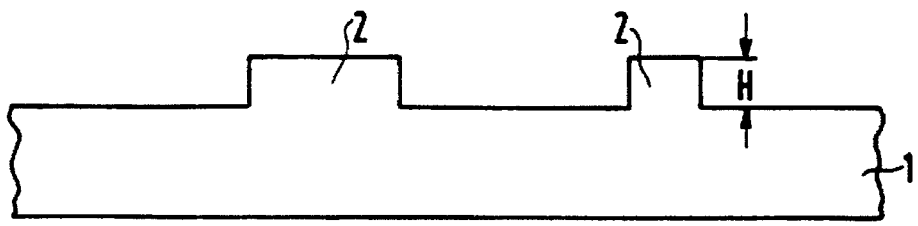
FIG. 1 shows a semiconductor layer structure of the present invention having elevations in the surface.

A semiconductor layer structure 1 has elevations 2 at its surface (see FIG. 1). For example, the semiconductor layer structure 1 is a silicon substrate having structures for an integrated circuit or is an SOI substrate having structures for an integrated circuit. The elevations 2 have a maximum step height H. The step height of the elevations 2 range between 0.1 and 1 μm.

Figure 2:
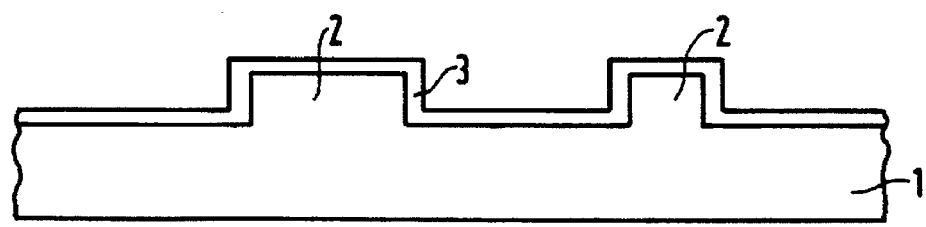
FIG. 2 shows the semiconductor layer structure of the present invention after deposition of a stop layer.

A stop layer 3 is applied surface-wide onto the surface of the semiconductor layer structure 1 (see FIG. 2). For example, the stop layer 3 is formed of a $SiO_2$ layer having a thickness of, for example 10 nm that is formed by thermal oxidation and is formed of a $Si_3N_4$ layer deposited thereon with a thickness of, for example, 100 nm. The stop layer 3 is essentially produced with conformal edge coverage.

Figure 3:
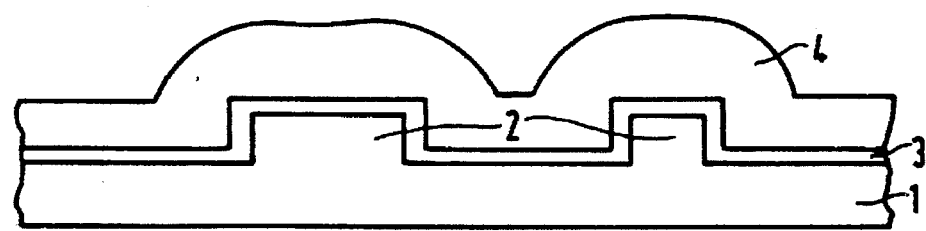
FIG. 3 shows the semiconductor layer structure of the present invention after deposition of an insulating layer.

An insulating layer 4 is deposited surface-wide (see FIG. 3). For example, the insulating layer 4 is formed by deposition of $SiO_2$ in a TEOS process or is formed by deposition of boron silicate glass. The thickness of the insulating layer 4 is at least as large as the maximum step height of the elevations 2. The insulating layer 4 is deposited, for example, with a thickness of 1.5 μm.

Figure 4:
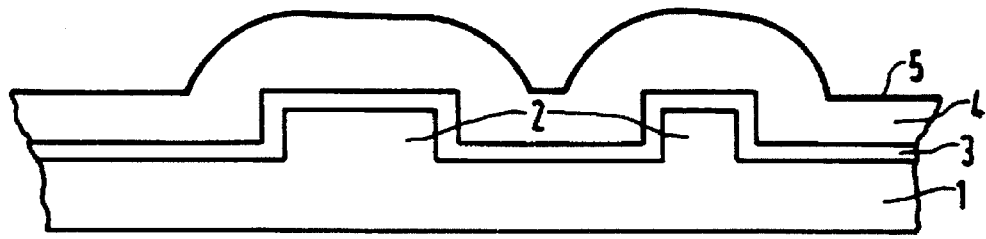
FIG. 4 shows the semiconductor layer structure of the present invention after deposition of an auxiliary layer.

An auxiliary layer 5 is selectively etchable both with respect to the insulating layer as well as with respect to the material of the stop layer. The auxiliary layer 5 is applied surface-wide onto the insulating layer 4. The selectivity must be valid both for wet-chemical as well as for dry etching processes. The auxiliary layer 5 (FIG. 4), is polysilicon having a thickness, for example, of 20–100 nm.

Figure 5:
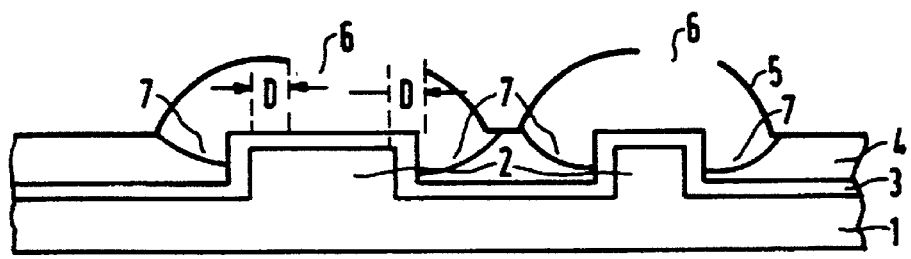
FIG. 5 shows the semiconductor layer structure of the present invention after the structuring the insulating layer.

Referring to FIG. 5, the auxiliary layer 5 is structured by using an auxiliary mask. The auxiliary mask has essentially the same structures with inverse contrast as the mask used for the manufacture of the elevations 2. The mask reserve of the auxiliary mask is selected such that openings 6 opened in the auxiliary layer 5 by using the auxiliary mask have at most the same expanse as the elevations 2 in lateral direction, i.e. parallel to the surface of the semiconductor layer structure. The auxiliary mask is adjusted with a typical alignment tolerance of +/−100 nm. It is therefore expedient to reduce the size of the structures in the auxiliary mask by this amount in width and length in comparison to the structures in the original mask.

The production of the openings 6 in the auxiliary layer 5 ensues, for example, by negative ion etching. By using the structured auxiliary layer 5 as etching mask, an isotropic etching is subsequently implemented by using a dilute solution of HF and water in the ratio of, for example, 1:10. The isotropic etching attacks the insulating layer 4 selectively relative to the auxiliary layer 5 and relative to the stop layer 3 lying therebelow.

The etching is continued until an overall oxide thickness $d_{ox}=h+h/2+D$ has been etched. The thickness of the insulating layer 4 is thereby referenced h and D indicates the deadjustment of the edges of the openings 6 in the auxiliary layer 5 relative to the edges of the elevations 2 (see FIG. 5). Irregularities 7 laterally from the elevations 2 occur in the insulating layer 4 in this etching step. The effective thickness of the insulating layer 4 is less than the maximum step height of the elevations 2 in the region of the irregularities 7.

In order to assure that no peaks of the insulating layer 4 project beyond the maximum step height after the isotropic etching, twice the alignment tolerance of, typically +/–100 nm, i.e. 200 nm is set for the deadjustment D.

Figure 6:
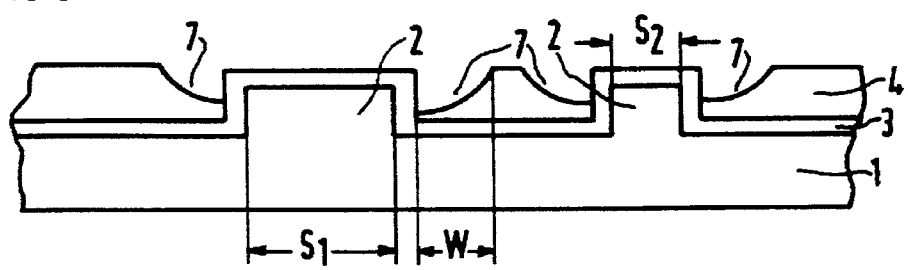
FIG. 6 shows the semiconductor layer structure of the present invention after the removal of the auxiliary layer.

FIG. 6 shows the semiconductor layer structure 1 after the removal of the auxiliary layer 5. After the structuring, the insulating layer 4 terminates in height essentially flush with the elevations 2. It has the irregularities 7 wherein the thickness of the insulating layer 4 is reduced. The lateral expanse W of the irregularities 7 is dependent on the duration of the isotropic etching process and on the deadjustment of the openings 6 relative to the elevations 2. The lateral expanse W, in particular, is independent of the lateral structure size $S_1$, $S_2$ of the elevations 2. In the following planarization processes, only the irregularities 7 which have essentially the same, constant lateral expanse W need therefore be planarized, regardless of the lateral structures sizes $S_1$, $S_2$ of the elevations 2.

Figure 7:
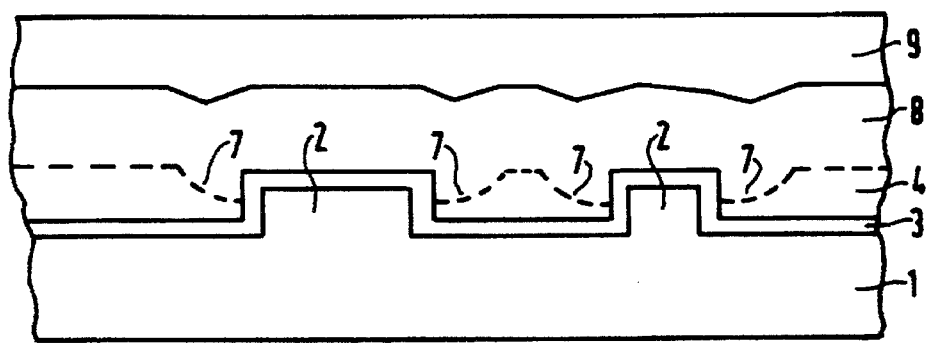
FIG. 7 shows the semiconductor layer structure of the present invention after the application of a further insulating layer and of a planarization layer.

A further insulating layer 8 is subsequently applied, for example by deposition of $SiO_2$ in a TEOS process (see FIG. 7). The further insulating layer 8 has an irregular surface that is caused by the irregularities 7 in the insulating layer 4.

A planarization layer 9 is applied onto the further insulating layer 8. For example, the planarization layer 9 is formed of lacquer. By flowing, the planarization layer 9 compensates for the irregular surface of the further insulating layer 8 and has a planar surface itself (see FIG. 7).

Figure 8:
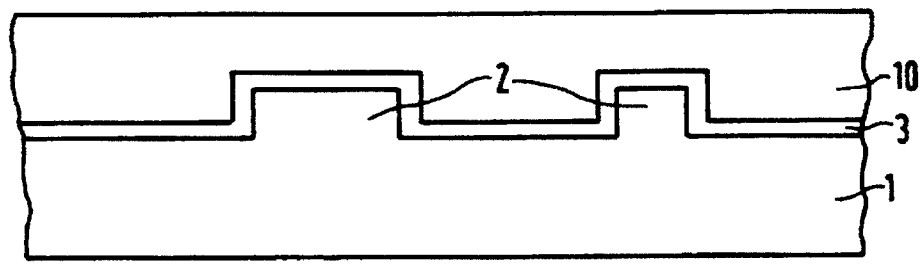
FIG. 8 shows the semiconductor layer structure of the present invention after etch-back of the planarization layer.

A planarized, insulating layer 10 arises by etch-back in, for example, a dry etching process (see FIG. 8). The degree of etch-back and, thus, the thickness of the planarized, insulating layer 10 is set in conformity with the respective use.

Figure 9:
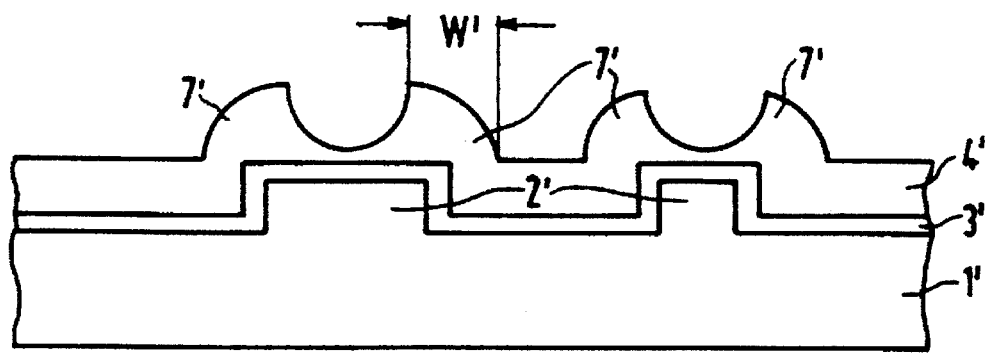
FIG. 9 shows a further embodiment of the structuring of the insulating layer of the present invention.

FIG. 9 shows a semiconductor layer structure 1' having elevations 2' with a maximum step height. A structured, insulating layer 4' is arranged on the surface of the semiconductor layer structure 1'. In the region of the edges of the elevations 2', the insulating layer 4' has irregularities 7' that project beyond the maximum step height. The structure shown in FIG. 9 occurs when the etching in the isotropic etching process that was set forth with reference to FIG. 5 is implemented only until an oxide thickness corresponding to the thickness of the insulating layer 4' has been etched. The irregularities 7' of the insulating layer 4' have a lateral expanse W' that is dependent on the adjustment precision of the auxiliary mask and on the thickness of the insulating layer 4'. The irregularities 7' are arranged in the region of the edges of the elevations 2'. Their lateral expanse is independent of the lateral structure size of the elevations 2'. The irregularities 7' projecting beyond the plane of the insulating layer 4' are preferably planarized by chemical mechanical polishing. When the surface of the stop layer 3' is uncovered in the region of the elevations 2', a chemical mechanical polishing is ended.

Figure 10:
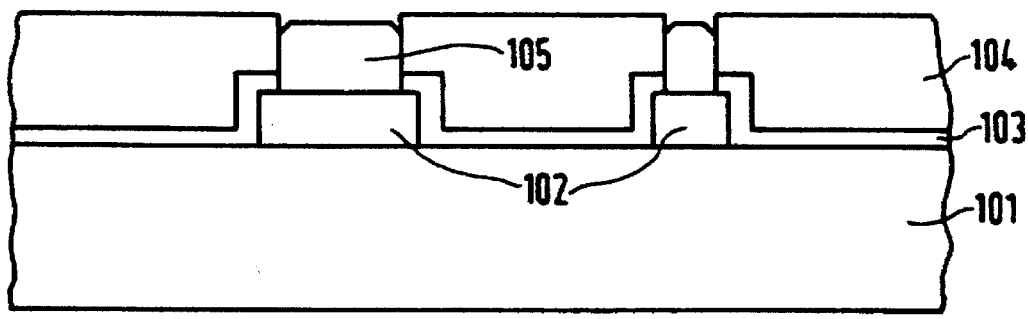
FIG. 10 shows a semiconductor layer structure of the present invention having an insulating layer whose surface has been planarized, wherein an active transistor region for a bipolar transistor was formed by selective epitaxy.

The application of the method of the invention in bipolar manufacturing shall be set forth with reference to FIG. 10. A semiconductor layer structure 101 is provided with elevations 102 of monocrystalline silicon. The elevations 102 are provided as buried layers for the connection of a collector of a bipolar transistor. The surface of the semiconductor layer structure 101 and of the elevations 102 is covered with a stop layer 103. An insulating layer 104 whose surface is planarized by using the inventive method is arranged on the stop layer 103. The surface of the elevations 102 is uncovered in openings that are produced in the insulating layer 104. A monocrystalline region 105 that can be used as collector and/or as active region of a bipolar transistor is produced on the surface of the elevations 102 by selective epitaxy. The insulating layer 104 in this example is produced with a thickness of 200–600 nm.

Figure 11:
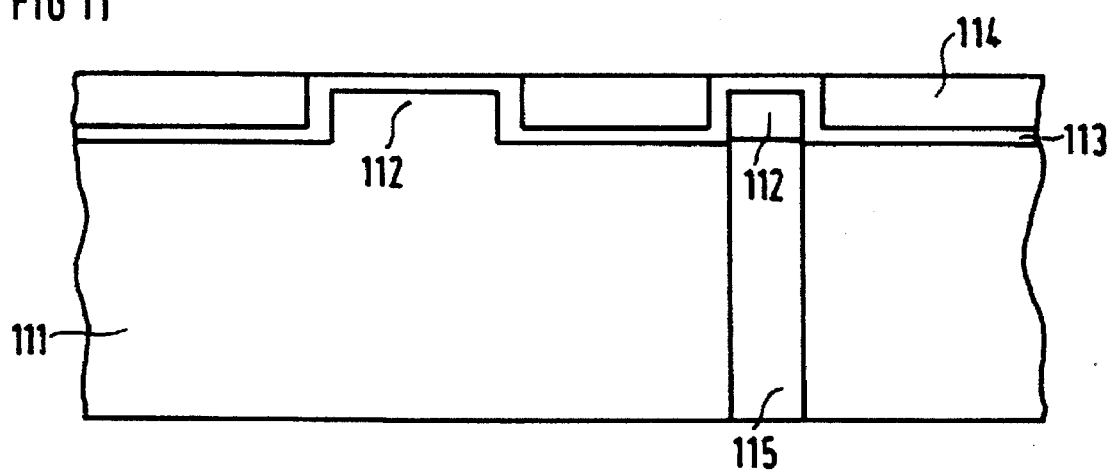
FIG. 11 shows a semiconductor layer structure of the present invention that has a DRAM arrangement having shallow trench insulation.

A further possible application of the method of the invention is the manufacture of what is referred to as a shallow trench isolation for DRAM. For example, shallow trench isolation is known from V. Comello, 28/Semiconductor International, March 1990. Active transistor regions and memory nodes that are essentially arranged in one level of the circuit are thereby insulated from one another by shallow trenches that are filled with an insulation. A semiconductor layer structure 111 (see FIG. 11) then has an active transistor region and a memory node as elevations 112. The memory node is arranged above a storage capacitor 115 arranged in a trench. The surface of the semiconductor layer structure 111 and of the elevations 112 is provided with a stop layer 113. A planarized, insulating layer 114 is produced thereon according to the method of the invention. The insulating layer 114 is planarized such that the surface of the stop layer 113 is uncovered above the elevations 112.

The memory node, also referred to as trench node, is used for the read-out of the storage capacitor. A selection MOS transistor is accommodated in the active transistor region. A lead between memory node and active transistor region is not visible in the section of FIG. 11. The shallow trench isolation serves the purpose of isolating all selection transistors laterally from the storage capacitor arranged in the trench shown in FIG. 11. Likewise, all other storage capacitors and transistors are isolated from one another. The insulation relative to the substrate ensues via a pn-junction or by SOI insulation that are not shown here.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. Method for producing a semiconductor layer structure having a planarized surface, said method comprising the steps of:

applying an insulating layer onto a surface of said semiconductor layer structure having elevations with edges having a maximum step height, said insulating layer having a thickness greater than said maximum step height;

etching said insulating layer to have irregularities with an essentially identical lateral expanse in a region of said edges of said elevations; and planarizing said irregularities by conducting a technique selected from the group consisting of chemical mechanical polishing and deposition, flowing and etch-back of a planarization layer.

2. Method according to claim 1, wherein each elevation has a lateral expanse and wherein said step of structuring said insulating layer is further defined by applying a stop layer having essentially conformal edge coverage under said insulating layer and also applying an auxiliary layer onto said insulating layer, said insulating layer being selectively etchable relative to said auxiliary layer and to said stop layer to produce an uncovered surface of said insulating layer;

producing an opening in said auxiliary layer above each elevation, each said opening having an opening expanse no larger than the lateral expanse of the elevation therebelow;

implementing an isotropic etching process selectively relative to said auxiliary layer and said stop layer for structuring said insulating layer; and removing said auxiliary layer after structuring said insulating layer.

3. Method according to claim 2, wherein said step of producing openings having an expanse less than or equal to an expanse of said elevation is further defined by forming said openings in said auxiliary layer with a photolithographic process using an auxiliary mask, said auxiliary mask having essentially the same structures with inverse contrast as a mask used for producing said elevations.

4. Method according to claim 2, wherein said step of implementing an isotropic etching process is further defined by implementing said isotropic etching process until said surface of said stop layer is reached inside said openings.

5. Method according to claim 2, wherein said step of implementing an isotropic etching process is further defined by implementing said isotropic etching process at least until a material thickness of $d_{ox}=h+h/2+D$ has been etched, where h is the thickness of said insulating layer and D is a deadjustment with which said openings are produced relative to said elevations.

6. Method according to claim 5, further comprising the step of:

applying a further insulating layer surface-wide after said step of removing said auxiliary layer, said further insulating layer having an essentially planar surface due to conducting a technique selected from the group consisting of chemical mechanical polishing and deposition, flowing and etch-back of a planarization layer.

7. Method according to claim 2, wherein said step of applying a stop layer having essentially conformal edge coverage under said insulating layer and also applying an auxiliary layer onto said insulating layer is further defined by providing said stop layer with $Si_3N_4$ at least at its surface and providing said auxiliary layer is polysilicon.

8. Method according to claim 1, wherein said step of applying an insulating layer onto a surface of said semiconductor layer structure is further defined by providing said insulating layer is an intermediate oxide layer and said semiconductor layer structure has an integrated circuit on a silicon base.

9. The method according to claim 1, further comprising the steps of:

producing an opening in said insulating layer onto said semiconductor surface; and producing active transistor regions in said opening by selective epitaxy to manufacture a bipolar transistor after said step planarizing said irregularities.

10. The method according to claim 1, further comprising the steps of:

providing active transistor regions and memory nodes as said elevations in said semiconductor layer structure;

producing shallow trenches in said semiconductor layer structure to insulate said active transistor regions and said memory nodes from each other;

filling said shallow trenches with an insulation to manufacture a DRAM; and providing a stop layer on said semiconductor layer structure and said elevations before planarizing said semiconductor layer structure.

* * * * *